United States Patent
Hwang et al.

[11] Patent Number: 5,933,704
[45] Date of Patent: Aug. 3, 1999

[54] METHOD TO REVEAL THE ARCHITECTURE OF MULTILAYER INTERCONNECTORS IN INTEGRATED CIRCUITS

[75] Inventors: Ruey-Lian Hwang; Yung-Sheng Huang; Chin-Cheng Chiu, all of Hsin-Chu, Taiwan

[73] Assignee: Taiwan Semiconductor Manufacturing Company, Ltd., Hsin-Chu, Taiwan

[21] Appl. No.: 08/865,847

[22] Filed: Jun. 2, 1997

[51] Int. Cl.[6] ................................................. H01L 21/00
[52] U.S. Cl. ........................... 438/14; 438/622; 438/637; 438/710
[58] Field of Search .................... 438/4, 14, 15, 438/700, 712, 622, 637, 624, FOR 395, 710; 29/593

[56] References Cited

U.S. PATENT DOCUMENTS

| | | | |
|---|---|---|---|
| 4,900,695 | 2/1990 | Takahashi et al. | 438/625 |
| 5,028,780 | 7/1991 | Kaito et al. | 250/307 |
| 5,413,962 | 5/1995 | Lur et al. | 438/619 |
| 5,583,344 | 12/1996 | Mizumura et al. | 250/492.21 |

*Primary Examiner*—Olik Chaudhuri
*Assistant Examiner*—Kurt Eaton
*Attorney, Agent, or Firm*—George O. Saile; Stephen B. Ackerman; Rosemary L. S. Pike

[57] ABSTRACT

A new method of preparing for inspection a wafer having multilayer interconnections is described. Semiconductor device structures having multilayer interconnections are provided in and on a semiconductor substrate wherein the multilayer interconnections comprise alternating layers of oxide interlevel dielectric layers and conducting layers and wherein interconnections are made between the conducting layers through the interlevel dielectric layers and wherein a non-oxide passivation layer overlies the topmost dielectric layer. The non-oxide passivation layer is removed and an oxide passivation layer is deposited overlying the topmost dielectric layer. The oxide passivation layer and interlevel dielectric layers and conducting layers are cut through to expose a sidewall to reveal the multilayer interconnections. The interlevel dielectric layers between conducting layers in the area of the exposed sidewall are removed to complete preparation for observing the semiconductor wafer having multilayer interconnections.

16 Claims, 4 Drawing Sheets

METHOD TO REVEAL THE ARCHITECTURE OF MULTILAYER INTERCONNECTORS IN INTEGRATED CIRCUITS

BACKGROUND OF THE INVENTION (1) Field of the Invention

The invention relates to a method of analyzing the structure of multilayer interconnectors in the fabrication of integrated circuits, and more particularly, to a method of revealing three dimensional structures in analyzing the structure of multilayer interconnections in the manufacture of integrated circuits.

(2) Description of the Prior Art

Successful integrated circuit device manufacture requires continued monitoring of the results of the fabrication processes. Monitoring may be performed visually or by using tools such as the Scanning Electron Microscope (SEM). Defects or problems in the manufacturing process then can be detected and corrected.

It is difficult to inspect three-dimensional structures of multilayer interconnections, such as 3 or 4 layers. Typically, the wafer is prepared for analysis by SEM by removing the interlevel dielectric layers adjacent to the interconnection area to be observed. When the sidewall structure is exposed, the SEM analysis can be performed. Conventionally, the interlevel dielectric layers are removed by reactive ion etching (RIE) or by wet etching. RIE has poor selectivity to metal connectors so that some of the metal is removed during the removal of the interlevel dielectric layers. Also, a dielectric layer underlying metal interconnectors cannot be removed completely by RIE. When the dielectric layers are removed by wet etching, the etching time must be long enough to remove the bottom dielectric layer. This etching time is so long that the top metal lines may be lifted off.

U.S. Pat. No. 4,900,695 to Takahashi et al shows a method of using a focused ion beam to etch out a portion of an insulating layer. U.S. Pat. No. 5,028,780 to Kaito et al teaches a method of preparing microsections for analysis by first depositing a film to planarize the section, then using a focused ion beam to etch a rectangular groove for observation. U.S. Pat. No. 5,583,344 to Mizumura et al teaches a method and an apparatus for using a focused ion beam to prepare a wafer for analysis in which the substances emitted from the ion source do not contaminate the wafer for further processing.

SUMMARY OF THE INVENTION

A principal object of the present invention is to provide an effective and very manufacturable method of preparing a wafer for inspection in the fabrication of integrated circuit devices.

Another object of the invention is to provide a method for preparing a wafer for inspection wherein three dimensional structures of multilayer interconnectors will be revealed.

A further object of the invention is to provide a method for preparing a wafer for inspection by removing the interlayer dielectric layers without lifting the overlying metal layers.

In accordance with the objects of this invention a new method of preparing for inspection a wafer having multilayer interconnections is achieved. Semiconductor device structures having multilayer interconnections are provided in and on a semiconductor substrate wherein the multilayer interconnections comprise alternating layers of oxide interlevel dielectric layers and conducting layers and wherein interconnections are made between the conducting layers through the interlevel dielectric layers and wherein a non-oxide passivation layer overlies the topmost dielectric layer. The non-oxide passivation layer is removed and an oxide passivation layer is deposited overlying the topmost dielectric layer. The oxide passivation layer and interlevel dielectric layers and conducting layers are cut through to expose a sidewall to reveal the multilayer interconnections. The interlevel dielectric layers between conducting layers in the area of the exposed sidewall are removed to complete preparation for observing the semiconductor wafer having multilayer interconnections.

BRIEF DESCRIPTION OF THE DRAWINGS

In the accompanying drawings forming a material part of this description, there is shown.

DESCRIPTION OF THE PREFERRED EMBODIMENTS

Figure 1:
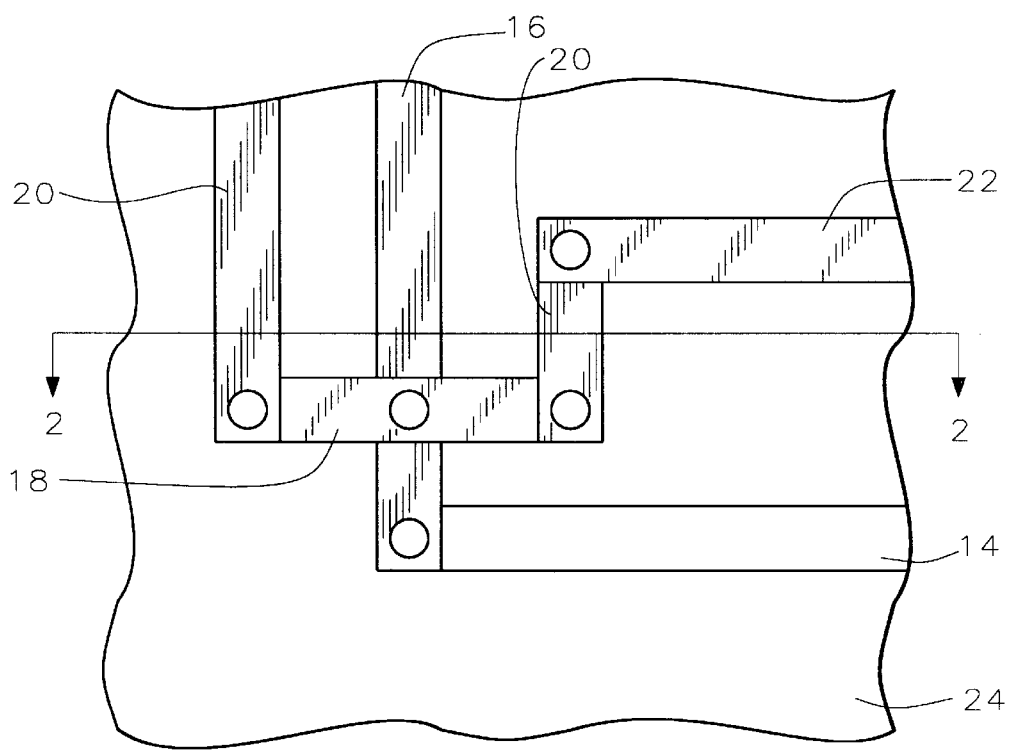
FIG. 1 schematically illustrates a top view of a preferred embodiment of the present invention.
Figure 2:
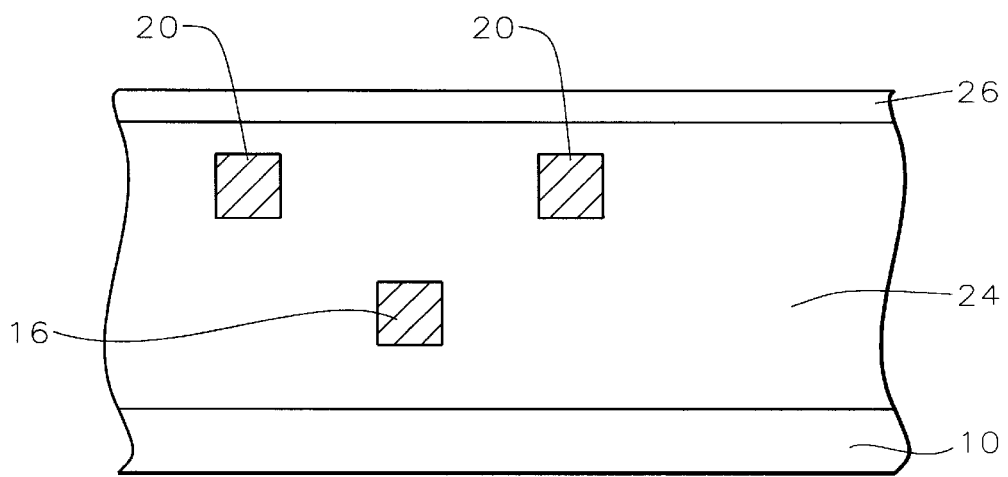
FIGS. 2 and 3 schematically illustrate in cross-sectional representation a preferred embodiment of the present invention.

Referring now more particularly to FIG. 1, there is illustrated a top view of a portion of a partially completed integrated circuit device. FIG. 2 illustrates a cross-section of view 2—2 of the same device. There is shown a semiconductor substrate 10, preferably composed of monocrystalline silicon. Multiple interconnection layers have been formed overlying the semiconductor substrate. The top view of FIG. 1 shows a polysilicon layer 14, first metal layer 16, second metal layer 18, third metal layer 20, and fourth metal layer 22. Intermetal and interlevel dielectric oxide layers 24 have been formed overlying each of the polysilicon and metal layers. A topmost passivation layer 26, typically a nitride, is deposited overlying the topmost interlevel dielectric oxide layer.

The cross-section in FIG. 2 is to be observed, for example, by a Scanning Electron Microscope (SEM). The three-dimensional structure of multiple layers is to be observed. For simplicity, the section illustrated has only two levels of metal lines. However, it is to be understood that the process of the invention will be used also in areas where three or four levels of metal lines and interconnections are to be observed.

Figure 3:
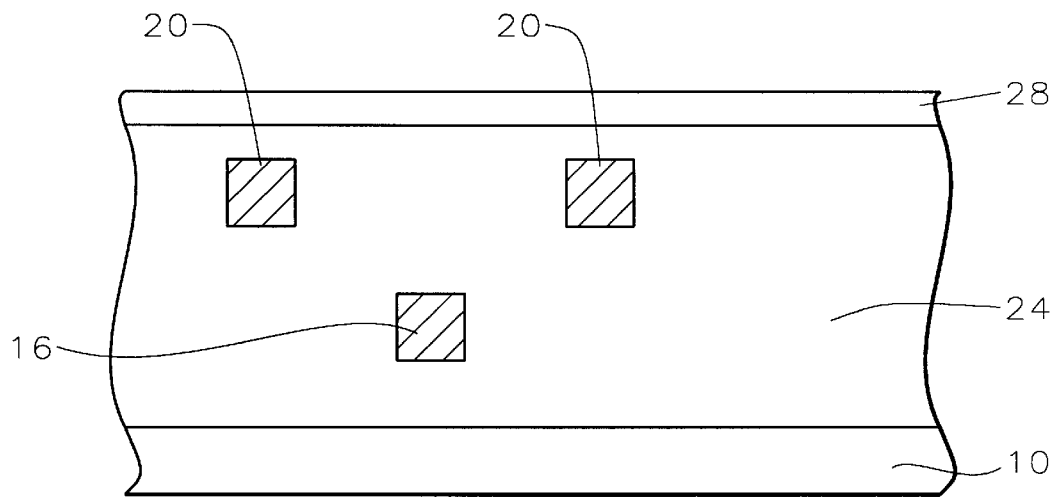

In the process of the invention, the first step in preparing the wafer for analysis or inspection is to remove the non-oxide passivation layer. In its place, an oxide layer 28 is deposited overlying the fourth metal layer, as illustrated in FIG. 3. This is done so that the dielectric layers are all of an oxide material so that they can be removed later by one etching step.

Figure 4:
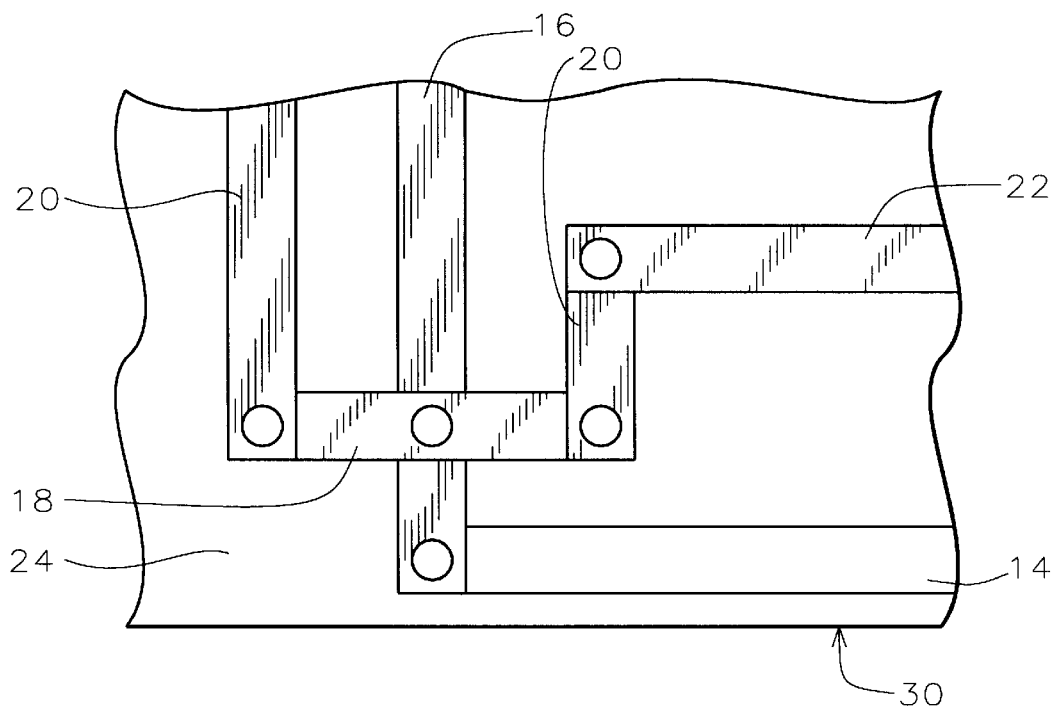
FIG. 4 schematically illustrates a top view of a first alternative in a preferred embodiment of the present invention.

Now the sidewall is to be exposed for analysis by SEM. This can be done by one of two methods. In the first method, micro-cleavage is applied to perform precise cutting to expose the sidewall. The wafer is cleaved as close as possible to the region of interest. FIG. 4 illustrates the cut 30 which exposes the sidewall of the area of interest.

In the second method, according to the present invention, a focused ion beam (FIB) process is used to remove the oxide between the interconnectors in the area to be observed. Proper oxide thickness must be maintained alongside and overlying the interconnectors. This is done by ensuring that after the FIB cutting process, the remaining oxide thickness alongside the interconnectors is approximately equal to the remaining oxide thickness on top of the interconnectors.

A well is etched out adjacent to the area to be observed to expose the sidewall structure. This is illustrated in top view in FIG. 5 and in cross-section in FIG. 6. A focused ion beam is used to perform precise cross-section cutting with the ability to remove material quickly and selectively on a submicron scale. $Ga^+$ may be used as the ion source. A deep milling is employed to expose the sidewalls of the region of interest. The deep milling is illustrated by area 32 and deep well area 34 in FIGS. 5 and 6. As shown in FIG. 6, the deep milling removes the layers down to the semiconductor substrate 10. In addition, a shallow milling is employed to partially remove the oxide on the side and top of the interconnectors, as shown by shallow well 36. The depth of milling depends upon the circuit structure and is controlled by the sputtering time of the ion beam. As stated above, it is desired to have the remaining oxide thickness alongside the interconnectors approximately equal to the remaining oxide thickness on top of the interconnectors. One or more shallow wells may be cut in order to ensure the approximate equality of oxide thickness.

Now, the dielectric layers must be removed so that the metal interconnectors can be observed. An oxide etchant is selected having high selectivity to the metal interconnectors. The intermetal and interlevel dielectric layers are removed within the area to be observed. FIG. 7 is a slightly rotated three-dimensional view of the area shown in FIGS. 4, 5, and 6 after the intermetal and interlevel dielectric layers in the area of interest have been removed. The metal layers are not lifted off in the process of the present invention because the etching time required for completely removing the oxide layers is well-controlled.

Figure 5:
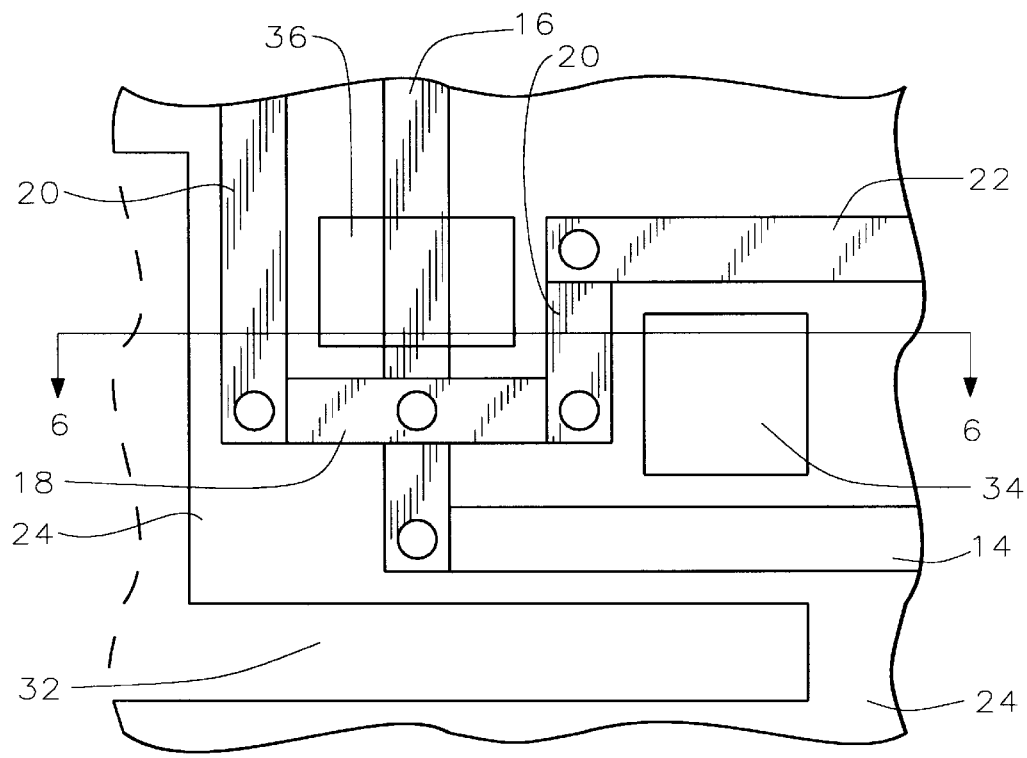
FIG. 5 schematically illustrates a top view of a second alternative in a preferred embodiment of the present invention.
Figure 6:
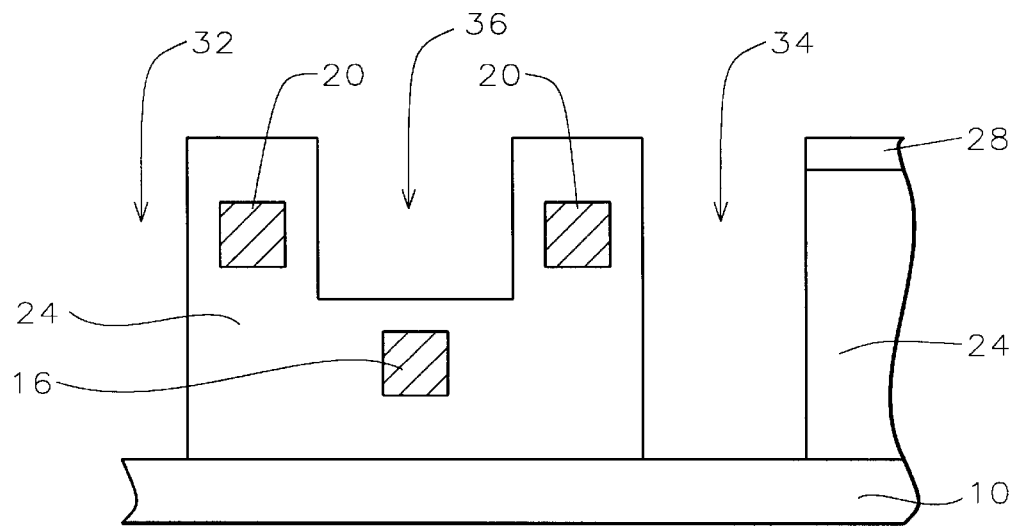
FIG. 6 schematically illustrates in cross-sectional representation a second alternative in a preferred embodiment of the present invention.
Figure 7:
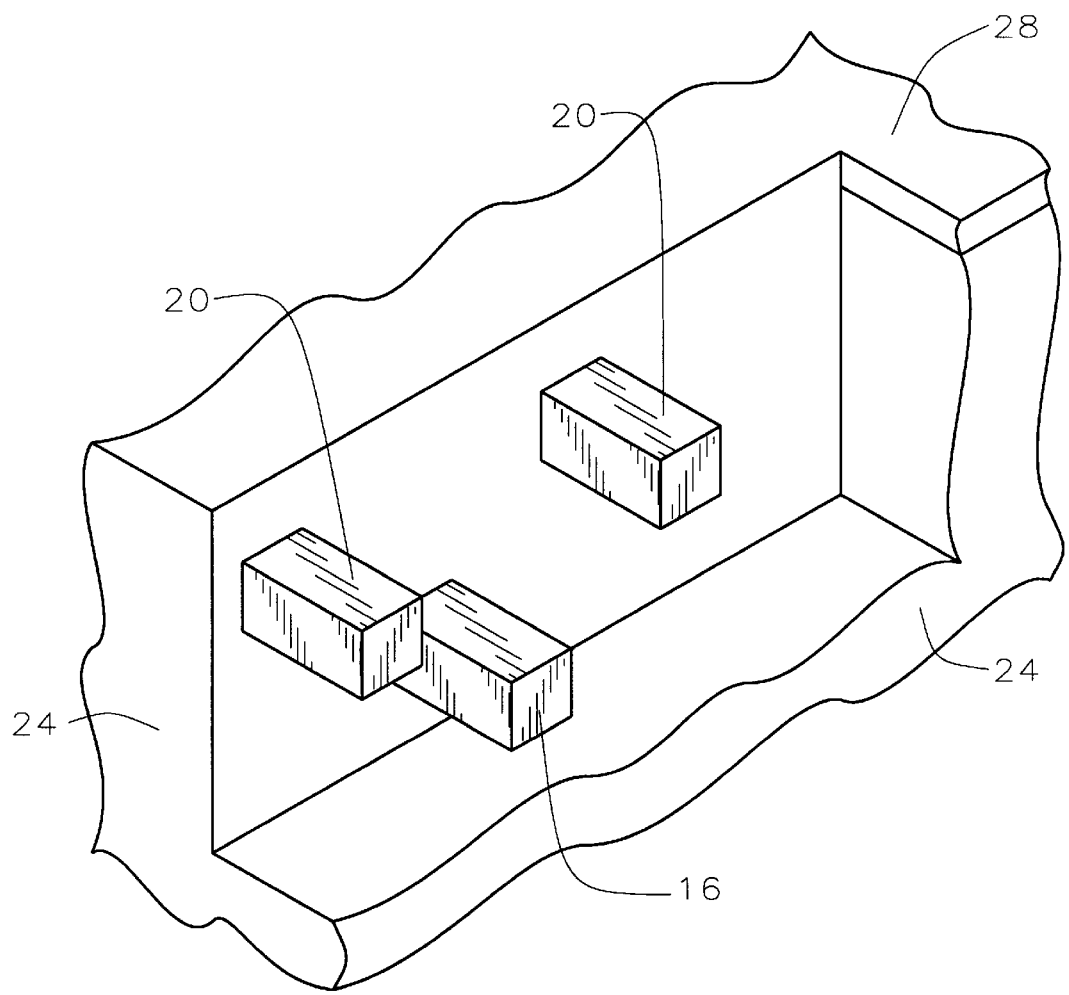
FIG. 7 schematically illustrates in three dimensional cross-sectional representation a preferred embodiment of the present invention.

This oxide removal may be done in the case of micro-cleavage, following FIG. 4, as well as in the case of FIB cutting, following FIGS. 5 and 6. The choice of micro-cleavage versus FIB is dependent upon the circuit structure of the area of interest. In general, if the interconnectors are distributed scarcely, the FIB cutting method is the better choice. The FIB cutting method ensures that the remaining oxide thickness alongside the interconnectors is approximately equal to the remaining oxide thickness on top of the interconnectors. If the interconnectors are closely packed, the oxide thicknesses will be approximately equal without the necessity of cutting shallow wells. In this case, the simpler method of micro-cleavage will be adequate.

A key feature of the present invention is the controlled removal of the oxide layers. Since the oxide layers to be removed are guaranteed to have approximately equal thicknesses on top and alongside the interconnectors, the oxide etching time can be controlled. The metal layers are not lifted off in the process of the present invention because the etching time required for completely removing the oxide layers is well-controlled.

After cutting, either by micro-cleavage or by FIB, and the oxide removal process of the present invention, the three-dimensional structure of the metal interconnectors is revealed, as shown in FIG. 7. The circuit structure can now be observed using the SEM or other methods to determine whether or not defects or problems have occurred in the manufacturing process.

The process of the invention provides a method for preparing a wafer for observation and analysis, such as by SEM, without disturbance of the metal interconnections to be observed, thereby revealing the three dimensional structure of the multiple interconnections.

While the invention has been particularly shown and described with reference to the preferred embodiments thereof, it will be understood by those skilled in the art that various changes in form and details may be made without departing from the spirit and scope of the invention.

What is claimed is:

1. A method of preparing for observation a semiconductor wafer having multilayer interconnections comprising:

providing semiconductor device structures having said multilayer interconnections in and on a semiconductor substrate wherein said multilayer interconnections comprise alternating layers of oxide interlevel dielectric layers and conducting layers and wherein interconnections are made between said conducting layers through said interlevel dielectric layers and wherein a non-oxide passivation layer overlies the topmost of said dielectric layers;

removing said non-oxide passivation layer;

thereafter depositing an oxide passivation layer overlying said topmost of said dielectric layers;

cutting through said oxide passivation layer and said interlevel dielectric layers and said conducting layers to expose a sidewall to reveal said multilayer interconnections; and removing said interlevel dielectric layers between said conducting layers in the area of said exposed sidewall to complete said preparing for observation said semiconductor wafer having multilayer interconnections.

2. The method according to claim 1 wherein said cutting through said oxide passivation layer and said interlevel dielectric layers and conducting layers comprises micro-cleavage.

3. The method according to claim 1 wherein said cutting through said oxide passivation layer and said interlevel dielectric layers and conducting layers comprises applying a focused ion beam to said layers.

4. The method according to claim 1 wherein said interlevel dielectric layers are removed by using an oxide etchant having high selectivity to said conducting layers.

5. A method for observing a section of a semiconductor wafer having multilayer interconnections, said semiconductor wafer having an outer surface and said section being along a plane which intersects said outer surface along an intersection line, comprising:

providing semiconductor device structures having said multilayer interconnections in and on a semiconductor substrate wherein said multilayer interconnections comprise alternating layers of oxide interlevel dielectric layers and conducting layers and wherein interconnections are made between said conducting layers through said interlevel dielectric layers and wherein an oxide passivation layer overlies the topmost of said dielectric layers;

cutting through said oxide passivation layer and said interlevel dielectric layers and said conducting layers along said plane to expose a sidewall to reveal said multilayer interconnections;

removing said interlevel dielectric layers between said conducting layers along said plane; and observing at least part of said plane.

6. The method according to claim 5 wherein said cutting through said oxide passivation layer and said interlevel dielectric layers and conducting layers comprises microcleavage.

7. The method according to claim 5 wherein said cutting through said oxide passivation layer and said interlevel dielectric layers and conducting layers comprises applying a focused ion beam to said layers.

8. The method according to claim 5 wherein said interlevel dielectric layers are removed by using an oxide etchant having high selectivity to said conducting layers.

9. The method according to claim 5 wherein said observing at least part of said plane is performed by Scanning Electron Microscope.

10. A method for observing a section of a semiconductor wafer having multilayer interconnections, said semiconductor wafer having an outer surface and said section being along a plane which intersects said outer surface along an intersection line, comprising:

providing semiconductor device structures having said multilayer interconnections in and on a semiconductor substrate wherein said multilayer interconnections comprise alternating layers of oxide interlevel dielectric layers and conducting layers and wherein interconnections are made between said conducting layers through said interlevel dielectric layers and wherein a non-oxide passivation layer overlies the topmost of said dielectric layers;

removing said non-oxide passivation layer;

thereafter depositing an oxide passivation layer overlying said topmost of said dielectric layers;

applying a focused ion beam to cut through said oxide passivation layer and said interlevel dielectric layers along said plane to expose a first sidewall to reveal said multilayer interconnections;

applying a focused ion beam to cut a deep well through said interlevel dielectric layers and said conducting layers a expose a second sidewall to reveal said multilayer interconnections wherein said section to be observed lies between said first and second sidewalls;

applying a focused ion beam to cut a shallow well through a top portion of said interlevel dielectric layers within said section to be observed wherein said multilayer interconnections underlie said shallow well;

thereafter removing said interlevel dielectric layers between said conducting layers within said section; and observing at least part of said plane.

11. The method according to claim 10 wherein said interlevel dielectric layers are removed by using an oxide etchant having high selectivity to said conducting layers.

12. The method according to claim 10 wherein said observing at least part of said plane is performed by Scanning Electron Microscope.

13. A method for observing a section of a semiconductor wafer having multilayer interconnections, said semiconductor wafer having an outer surface and said section being along a plane which intersects said outer surface along an intersection line, comprising:

providing semiconductor device structures having said multilayer interconnections in and on a semiconductor substrate wherein said multilayer interconnections comprise alternating layers of oxide interlevel dielectric layers and conducting layers and wherein interconnections are made between said conducting layers through said interlevel dielectric layers and wherein a non-oxide passivation layer overlies the topmost of said dielectric layers;

removing said non-oxide passivation layer;

thereafter depositing an oxide passivation layer overlying said topmost of said dielectric layers;

applying a focused ion beam to cut through said oxide passivation layer and said interlevel dielectric layers along said plane to expose a first sidewall to reveal said multilayer interconnections;

applying a focused ion beam to cut a deep well through said interlevel dielectric layers and said conducting layers a expose a second sidewall to reveal said multilayer interconnections wherein said section to be observed lies between said first and second sidewalls;

thereafter removing said interlevel dielectric layers between said conducting layers within said section; and observing at least part of said plane.

14. The method according to claim 13 further comprising applying a focused ion beam to cut a shallow well through a top portion of said interlevel dielectric layers within said section to be observed wherein said multilayer interconnections underlie said shallow well.

15. The method according to claim 13 wherein said interlevel dielectric layers are removed by using an oxide etchant having high selectivity to said conducting layers.

16. The method according to claim 13 wherein said observing at least part of said plane is performed by Scanning Electron Microscope.

\* \* \* \* \*